United States Patent
Cheng et al.

(10) Patent No.: US 9,966,427 B2
(45) Date of Patent: May 8, 2018

(54) METAL-INSULATOR-METAL (MIM) CAPACITOR WITH AN ELECTRODE SCHEME FOR IMPROVED MANUFACTURABILITY AND RELIABILITY

(71) Applicant: Taiwan Semiconductor Manufacturing Co., Ltd., Hsin-Chu (TW)

(72) Inventors: Shyh-Wei Cheng, Zhudong Township (TW); Hung-Lin Chen, Pingtung (TW); Jui-Chun Weng, Taipei (TW); Shiuan-Jeng Lin, Hsinchu (TW); Tian Sheng Lin, Yangmei Township (TW); Yu-Jui Wu, Hsin-Chu (TW); Albion Pan, Hsin-Chu (TW); Bob Sun, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/154,027

(22) Filed: May 13, 2016

(65) Prior Publication Data

US 2017/0330931 A1    Nov. 16, 2017

(51) Int. Cl.
*H01L 49/02* (2006.01)
*H01L 23/522* (2006.01)
*H01L 21/3213* (2006.01)
*H01L 21/311* (2006.01)

(52) U.S. Cl.
CPC ........ *H01L 28/75* (2013.01); *H01L 21/31111* (2013.01); *H01L 21/32139* (2013.01); *H01L 23/5223* (2013.01)

(58) Field of Classification Search
None
See application file for complete search history.

(56) References Cited

U.S. PATENT DOCUMENTS

| | | | | |
|---|---|---|---|---|
| 2003/0011043 | A1* | 1/2003 | Roberts | H01L 21/76802 257/532 |
| 2003/0022433 | A1* | 1/2003 | Ejiri | H01L 23/5222 438/240 |
| 2003/0119251 | A1* | 6/2003 | Aggarwal | C23C 14/08 438/239 |
| 2004/0180508 | A1* | 9/2004 | Park | H01L 28/60 438/393 |

* cited by examiner

*Primary Examiner* — Michelle Mandala
(74) *Attorney, Agent, or Firm* — Eschweiler & Potashnik, LLC

(57) ABSTRACT

A method for manufacturing a metal-insulator-metal (MIM) capacitor with a top electrode that is free of sidewall damage is provided. A bottom electrode layer is formed with a first material. An inter-electrode dielectric layer is formed over the bottom electrode layer. A top electrode layer is formed over the inter-electrode dielectric layer and without the first material. A first etch is performed into the top electrode layer and the inter-electrode dielectric layer to form a top electrode. A second etch into the bottom electrode layer to form a bottom electrode. The present application is also directed towards a MIM capacitor resulting from performing the method.

20 Claims, 7 Drawing Sheets

METAL-INSULATOR-METAL (MIM) CAPACITOR WITH AN ELECTRODE SCHEME FOR IMPROVED MANUFACTURABILITY AND RELIABILITY

BACKGROUND

A capacitor is a passive two-terminal electrical device used to store energy, and contains at least two electrodes separated by a dielectric region. The capacitance of a capacitor is proportional to the surface area of the electrodes, and inversely proportional to the thickness of the dielectric region. One type of capacitor is a metal-insulator-metal (MIM) capacitor. A MIM capacitor comprises an insulator sandwiched between two metal electrodes, and is formed within a back-end-of-line (BEOL) interconnect structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
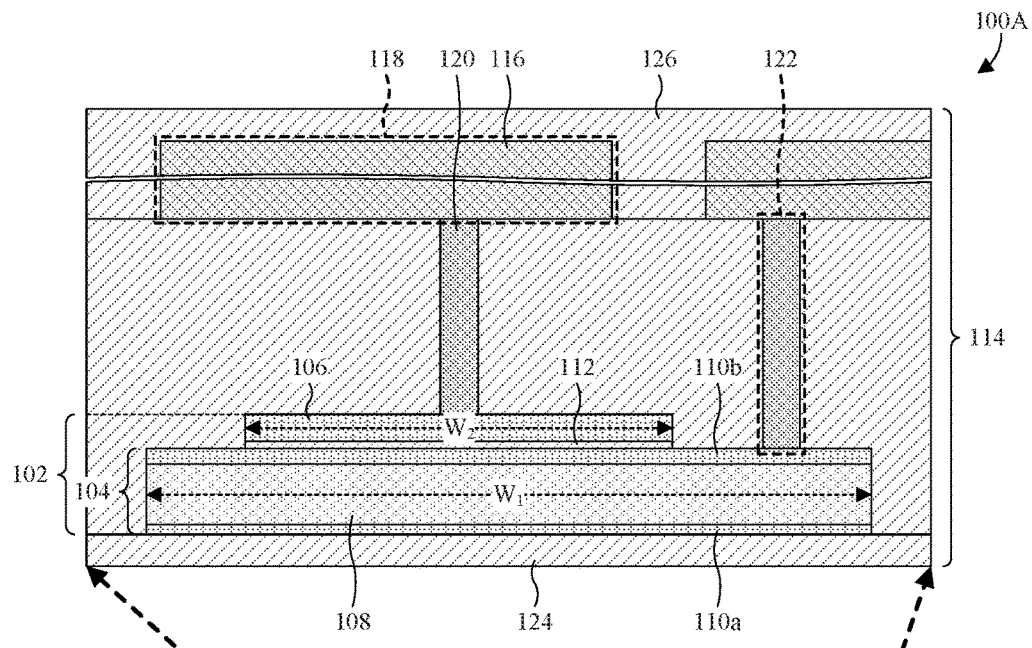
FIG. 1A illustrates a cross-sectional view of some embodiments of an integrated circuit (IC) comprising a metal-insulator-metal (MIM) capacitor with a top electrode that is free of sidewall damage.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some methods for manufacturing metal-insulator-metal (MIM) capacitors comprise sequentially forming a bottom electrode layer over a lower portion of an interconnect structure, a dielectric layer over the bottom electrode layer, and a top electrode layer over the dielectric layer. Thereafter, the top and bottom electrode layers are respectively patterned with photolithography to form a top electrode spaced over a bottom electrode by the dielectric layer. Often, the top and bottom electrodes comprise individual layers of aluminum copper and individual layers of titanium nitride masking the layers of aluminum copper.

A challenge with forming the top and bottom electrodes using aluminum copper is that the top and bottom electrodes may be susceptible to sidewall damage. Namely, after patterning the top and bottom electrodes layers, photoresist wet strip processes are performed to remove photoresist used to pattern the top and bottom electrode layers. Since sidewalls of the top and bottom electrodes may be exposed when the photoresist wet strip processes are performed, the sidewalls may be eroded by the photoresist wet strip processes. While the layers of titanium nitride are generally not susceptible to erosion by the photoresist wet strip processes, the layers of aluminum copper making up most surface area of the sidewalls are susceptible. Erosion of the sidewalls may, in turn, reduce dimensions of the top and bottom electrodes and reduce capacitances of the MIM capacitors.

The present application is directed towards a method for manufacturing a MIM capacitor with a top electrode that is free of sidewall damage. In some embodiments, a bottom electrode layer is formed and an inter-electrode dielectric layer is formed over the bottom electrode layer. A top electrode layer is formed over the inter-electrode dielectric layer and without a material of the bottom electrode layer. A first etch is performed into the top electrode layer and the inter-electrode dielectric layer to form a top electrode. A second etch is performed into the bottom electrode layer to form a bottom electrode. The present application is also directed towards a MIM capacitor resulting from performing the method.

Where the material is aluminum copper, sidewall damage to the top electrode may advantageously be avoided since the top electrode is formed without aluminum copper. As such, dimensions of the top electrode may be highly uniform during bulk manufacture. Further, since the dimensions of the top electrode are critical to capacitances of the MIM capacitor, the capacitances may be highly uniform during bulk manufacture. Even more, the process window for the method may be large since sidewall damage to the top electrode is avoided. Moreover, costs and cycle time may be low since fewer actions may be performed. For example, a layer of aluminum copper is not formed for the top electrode.

With reference to FIG. 1A, a cross-sectional view 100A of some embodiments of an integrated circuit (IC) with a MIM capacitor 102 is provided. As illustrated, the MIM capacitor 102 comprises a bottom electrode 104 and a top electrode 106. The bottom electrode 104 underlies the top electrode 106, and has a width $W_1$ that is larger than a width $W_2$ of the top electrode 106. The bottom electrode 104 comprises a metal layer 108, a first diffusion barrier layer 110a, and a second diffusion barrier layer 110b. The metal layer 108 is or otherwise comprises a first material, such as, for example, aluminum copper, copper, or aluminum. The first and second diffusion barrier layers 110a, 110b are or otherwise comprise a second material different than the first material, and respectively line a bottom surface of the metal layer 108 and a top surface of the metal layer 108. The second material may be, for example, titanium nitride, tantalum nitride, or niobium nitride. In alternative embodiments, the metal layer 108 and the first material are conductive, but not a metal, and/or the first and second diffusion barrier layers 110a, 110b are omitted.

The top electrode 106 is arranged over the bottom electrode 104, vertically spaced and insulated from the bottom electrode 104 by an inter-electrode dielectric layer 112. In some embodiments, the width $W_2$ of the top electrode 106 is the same as that of the inter-electrode dielectric layer 112. Further, in some embodiments, the top electrode 106 and/or the inter-electrode dielectric layer 112 are entirely arranged directly over the bottom electrode 104, and/or have widthwise centers laterally offset to one side of the bottom electrode 104 from a width-wise center of the bottom electrode 104. The top electrode 106 is devoid of the first material, and is or otherwise comprises a third material. The third material is different than first material and, in some embodiments, is the same as the second material. The third material may be, for example, titanium nitride, tantalum nitride, or niobium nitride. The inter-electrode dielectric layer 112 may be, for example, an oxide, such as a plasma-enhanced (PE) oxide, or a high-κ dielectric. A high-κ dielectric is a dielectric with a dielectric constant κ greater than about 3.9.

Where the first material is aluminum copper, the top electrode 106 may advantageously be free of sidewall damage since the top electrode 106 is devoid of aluminum copper and aluminum copper is susceptible to erosion during photoresist wet strip processes. As such, dimensions of the top electrode 106 and capacitances of the top electrode 106 may be highly uniform during bulk manufacture.

A back-end-of-line (BEOL) interconnect structure 114 accommodates the MIM capacitor 102, and comprises layers 116 of conductive features 118 and layers 120 of vias 122 alternatingly stacked within an ILD region. The conductive features 118 include the bottom electrode 104 and may be, for example, pads and/or lines. The layers 120 of vias 122 are configured to electrically couple the layers 116 of conductive features 118 to one another and to the MIM capacitor 102. In some embodiments, the bottom and top electrodes 104, 106 of the MIM capacitor 102 are electrically coupled to different conductive features by respective vias. The vias 122 and the conductive features 118 may be, for example, aluminum copper, copper, gold, aluminum, tungsten, some other metal, or a combination of the foregoing.

The ILD region accommodates the layers 116 of conductive features 118 and the layers 120 of vias 122, and comprises a stack of ILD layers 124 covered by a passivation layer 126. The ILD layers 124 are arranged between neighboring layers of conductive features, and the passivation layer 126 covers a topmost layer of conductive features. The ILD and passivation layers 124, 126 may be or otherwise comprise, for example, silicon dioxide, phosphosilicate glass (PSG), a low κ dielectric, or a combination of the foregoing. A low-κ dielectric is a dielectric with a dielectric constant κ less than about 3.9.

Figure 1B:
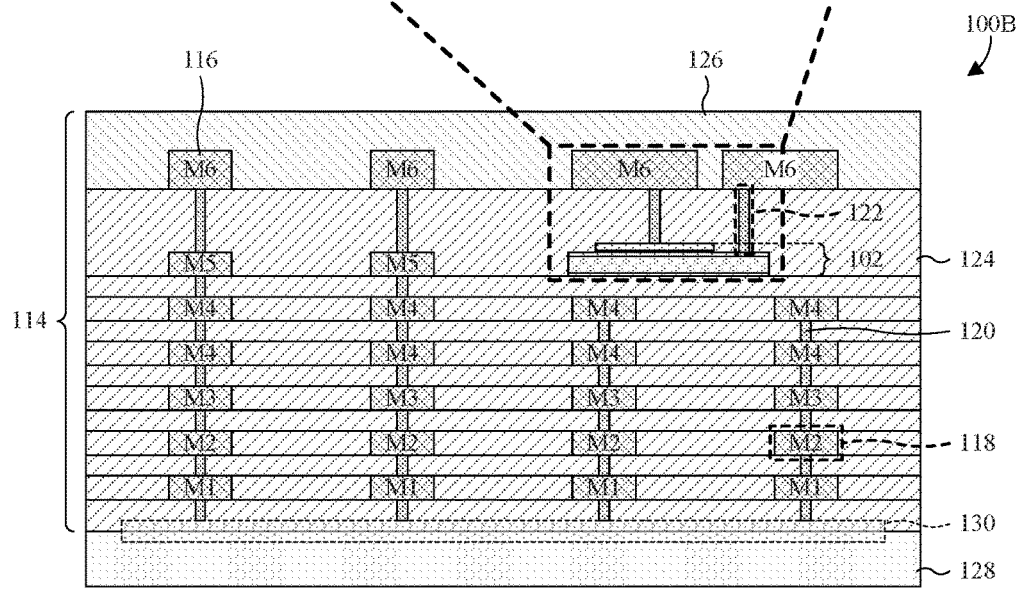
FIG. 1B illustrates an expanded cross-sectional view of some embodiments of the IC of FIG. 1B.

With reference to FIG. 1B, an expanded cross-sectional view 100B of some embodiments of the IC of FIG. 1A is provided. As illustrated, the BEOL interconnect structure 114 is arranged over a semiconductor substrate 128 and may, for example, comprise six layers of conductive features. The semiconductor substrate 128 supports a device region 130 arranged over the semiconductor substrate 128, vertically between the semiconductor substrate 128 and the BEOL interconnect structure 114. The semiconductor substrate 128 may be, for example, a bulk semiconductor substrate, such as a bulk substrate of monocrystalline silicon or some other silicon, or a silicon-on-insulator (SOI) substrate. The device region 130 comprises electronic devices (not individually shown), such as, for example, transistors, and is electrically coupled to the layers 116 of conductive features 118 by the vias 122.

Figure 2:
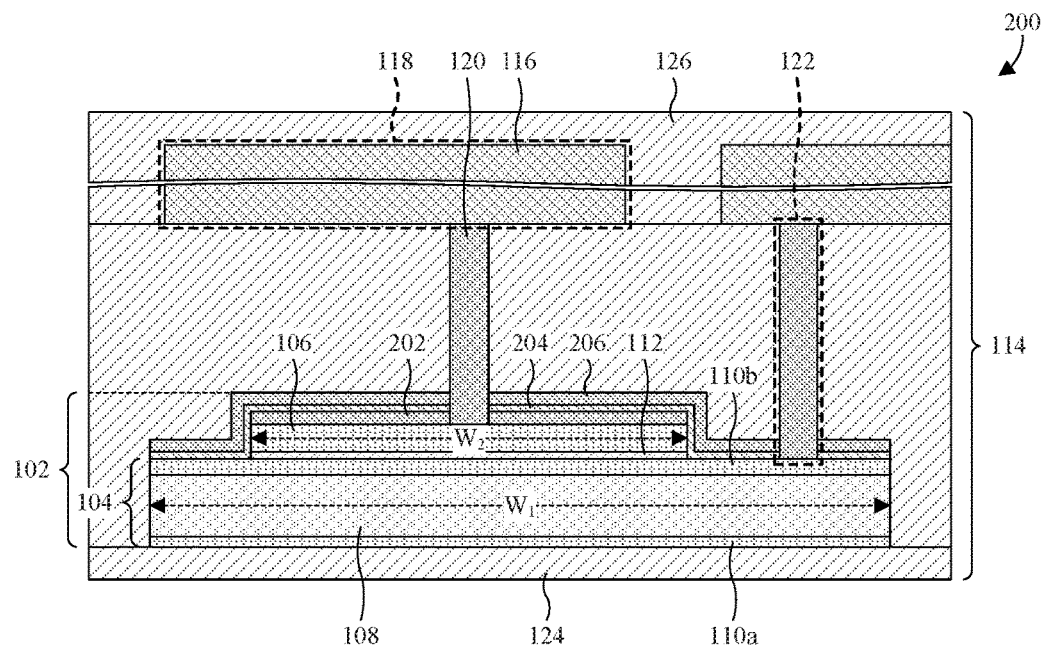
FIG. 2 illustrates a cross-sectional view of some more detailed embodiments of the IC of FIG. 1A.

With reference to FIG. 2, a cross-sectional view 200 of some more detailed embodiments of the IC of FIG. 1A is provided. As illustrated, a first anti-reflective layer 202 covers the top electrode 106 and has substantially the same width $W_2$ as the top electrode 106 and the inter-electrode dielectric layer 112. Further, in some embodiments, the first anti-reflective layer 202 has substantially the same two-dimensional (2D) projection onto an underlying horizontal plane as the top electrode 106 and the inter-electrode dielectric layer 112. The first anti-reflective layer 202 may be, for example, silicon oxy-nitride or some other material configured to absorb light.

A cap layer 204 covers the bottom and top electrodes 104, 106. Further, the cap layer 204 lines an upper or top surface of the bottom electrode 104, outer surfaces of the top electrode 106, outer surfaces of the inter-electrode dielectric layer 112, and outer surfaces of the first anti-reflective layer 202. The cap layer 204 has substantially the same width $W_1$ as the bottom electrode 104 and, in some embodiments, has substantially the same 2D projection onto an underlying horizontal plane as the bottom electrode 104. The cap layer 204 may be, for example, an oxide, such as a PE oxide, or some other dielectric.

A second anti-reflective layer 206 covers the cap layer 204 and lines upper or top surfaces of the cap layer 204. The second anti-reflective layer 206 has substantially the same width $W_2$ as the bottom electrode 104 and, in some embodiments, has substantially the same 2D projection onto an underlying horizontal plane as the bottom electrode 104. The second anti-reflective layer 206 may be, for example, silicon oxy-nitride or some other material configured to absorb light.

With reference to FIGS. 3-11, a series of cross-sectional views 300-1100 of some embodiments of a method for manufacturing a MIM capacitor is provided. The method may, for example, be employed to manufacture the MIM capacitor 102 of FIGS. 1A, 1B, and 2.

Figure 3:
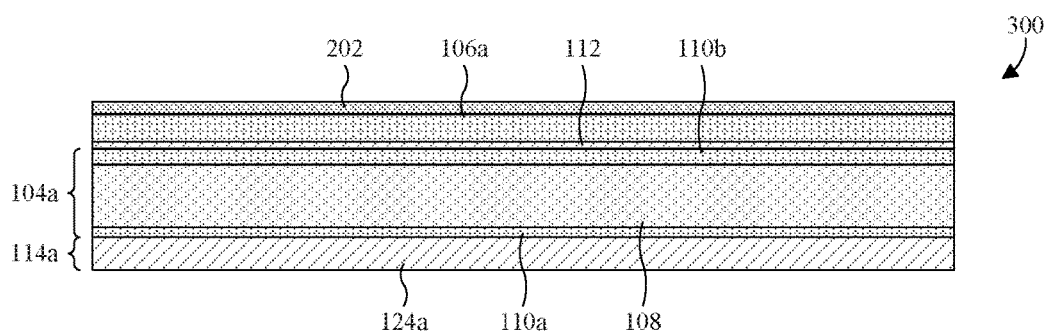
FIGS. 3-11 illustrate a series of cross-sectional views of some embodiments of a method for manufacturing a MIM capacitor with a top electrode that is free of sidewall damage.

As illustrated by the cross-sectional view 300 of FIG. 3, a bottom electrode layer 104a is formed over lower ILD layers 124a (partially shown) of a lower interconnect structure 114a. The bottom electrode layer 104a is formed by forming a first diffusion barrier layer 110a over the lower ILD layers 124a, a metal layer 108 over the first diffusion barrier layer 110a, and a second diffusion barrier layer 110b over the metal layer 108. The metal layer 108 is formed of a first material, and the first and second diffusion barrier layers 110a, 110b are formed of a second material different than the first material. The first material may be, for example, aluminum copper and the second material may be, for example, titanium nitride. In alternative embodiments, the first and second diffusion barrier layers 110a, 110b are not formed, and/or the metal layer 108 is formed of a conductive material other than metal.

In some embodiments, the first diffusion barrier layer 110a is formed with a thickness of about 200 to about 300 angstroms, the metal layer 108 is formed with a thickness of about 3500 to about 4500 angstroms, the second diffusion barrier layer 110b is formed with a thickness of about 600 to about 800 angstroms, or a combination of the foregoing. For example, the first diffusion barrier layer 110a may be formed with a thickness of about 250 angstroms, the metal layer 108 may be formed with a thickness of about 400 angstroms, the second diffusion barrier layer 110b may be formed with a thickness of about 700 angstroms, or a combination of the foregoing. Further, in some embodiments, the first diffusion barrier layer 110a is formed of titanium nitride, the metal layer 108 is formed of aluminum copper, the second diffusion barrier layer 110b is formed of titanium nitride, or a combination of the foregoing. Even more, in some embodiments, the first diffusion barrier layer 110a, the metal layer 108, the second diffusion barrier layer 110b, or a combination of the foregoing is/are formed conformally.

In some embodiments, the process for forming the first diffusion barrier layer 110a, the metal layer 108, and the second diffusion barrier layer 110b comprises sequentially depositing or growing the layers 110a, 108, 110b over the lower ILD layers 124a. For example, the first and second diffusion barrier layers 110a, 110b and the metal layer 108 may be deposited by vapor deposition, such as chemical vapor deposition (CVD) or physical vapor deposition (PVD), atomic layer deposition (ALD), or a combination of the foregoing. As another example, the metal layer 108 may be grown by electrochemical plating (ECP).

Also illustrated by the cross-sectional view 300 of FIG. 3, an inter-electrode dielectric layer 112 is formed over the second diffusion barrier layer 110b, a top electrode layer 106a is formed over the inter-electrode dielectric layer 112, and a first anti-reflective layer 202 is formed over the top electrode layer 106a. The top electrode layer 106a is formed of a third material different than the first material and, in some embodiments, the same as the second material. The third material may be, for example, titanium nitride.

In some embodiments, the inter-electrode dielectric layer 112 is formed with a thickness of about 150 to about 250 angstroms, the top electrode layer 106a is formed with a thickness of about 1000 to about 1400 angstroms, the first anti-reflective layer 202 is formed with a thickness of about 250 to about 400 angstroms, or a combination of the foregoing. For example, the inter-electrode dielectric layer 112 may be formed with a thickness of about 190 angstroms, the top electrode layer 106a may be formed with a thickness of about 1200 angstroms, the first anti-reflective layer 202 may be formed with a thickness of about 320 angstroms, or a combination of the foregoing. Further, in some embodiments, the top electrode layer 106a is formed with a thickness that is about 25% to about 35%, such as about 30%, of the thickness of the metal layer 108, and/or a thickness that is about 20% to about 35%, such as about 24%, of the thickness of bottom electrode layer 104a. Even more, in some embodiments, the inter-electrode dielectric layer 112 is formed of PE oxide, the top electrode layer 106a is formed of titanium nitride, the first anti-reflective layer 202 is formed of silicon oxy-nitride, or a combination of the foregoing. Moreover, in some embodiments, the inter-electrode dielectric layer 112, the top electrode layer 106a, the first anti-reflective layer 202, or a combination of the foregoing is/are formed conformally and/or with a uniform thickness.

In some embodiments, the process for forming the inter-electrode dielectric layer 112, the top electrode layer 106a, and the first anti-reflective layer 202 comprises sequentially depositing or growing the layers 112, 106a, 202 over the second diffusion barrier layer 110b. For example, the inter-electrode dielectric layer 112 may be grown by thermal oxidation or otherwise deposited by PE vapor deposition. As another example, the top electrode layer 106a and/or the first anti-reflective layer 202 may be deposited by vapor deposition or ALD.

Figure 4:
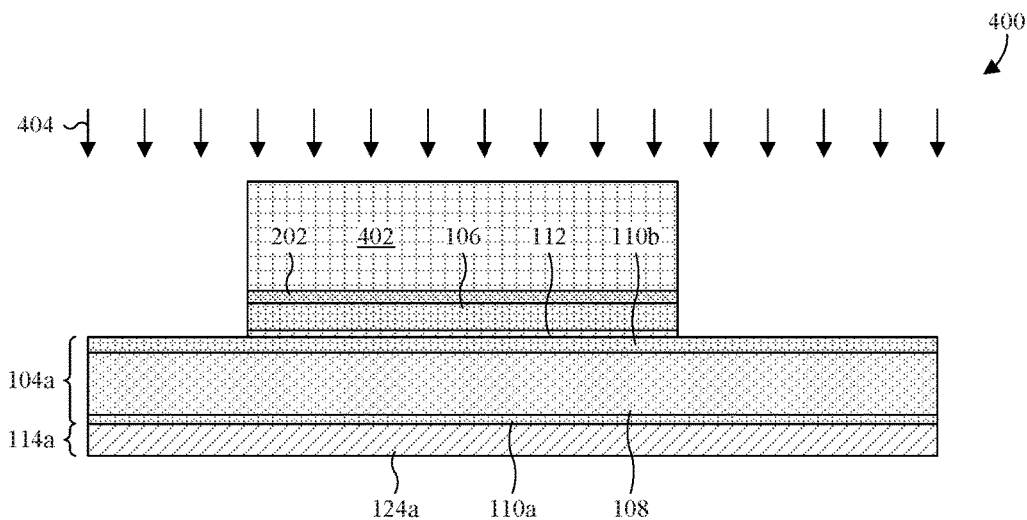

As illustrated by the cross-sectional view 400 of FIG. 4, a first etch is selectively performed into the first anti-reflective layer 202, the top electrode layer 106a (see FIG. 3), and the inter-electrode dielectric layer 112. The first etch results in a top electrode 106 masked by the first anti-reflective layer 202 and spaced over the bottom electrode layer 104a by the inter-electrode dielectric layer 112. Collectively, the top electrode 106, the first anti-reflective layer 202, and the inter-electrode dielectric layer 112 define a top electrode stack.

In some embodiments, the process for performing the first etch comprises forming a first photoresist layer 402 over the first anti-reflective layer 202 and subsequently patterning the first photoresist layer 402 using photolithography. The first photoresist layer 402 may, for example, be formed with a thickness of about 7000 to about 8000 angstroms, such as 7500 angstroms. Further, in some embodiments, the process comprises applying one or more etchants 404 to the first anti-reflective layer 202, the top electrode layer 106a, and the inter-electrode dielectric layer 112 with the first photoresist layer 402 in place, and subsequently stripping the first photoresist layer 402. The first photoresist layer 402 may, for example, be stripped with a sulfuric acid-hydrogen peroxide mixture (SPM).

Advantageously, where the metal layer 108 is formed of aluminum copper, the top electrode 106 may not be subject to sidewall damage from stripping the first photoresist layer 402 because it is free of aluminum copper. Accordingly, dimensions of the top electrode 106 may be highly uniform during bulk manufacture. Further, capacitances of the MIM capacitor may be highly uniform during bulk manufacture.

Figure 5:
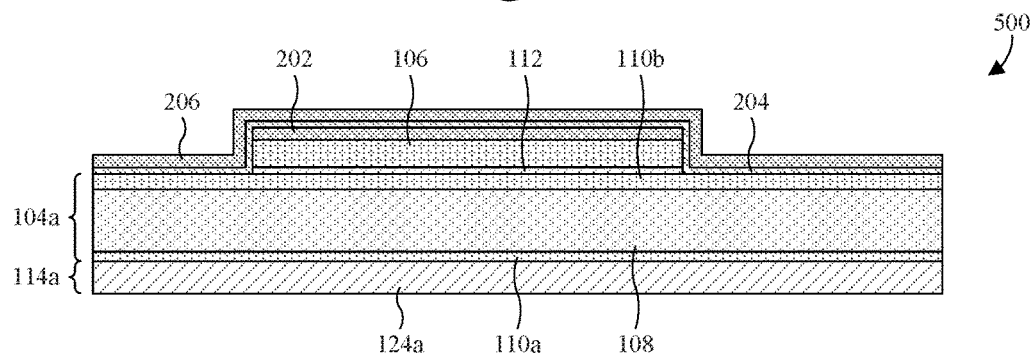

As illustrated by the cross-sectional view 500 of FIG. 5, a cap layer 204 is formed lining an upper or top surface of the second diffusion barrier layer 110b, and further lining outer surfaces of the inter-electrode dielectric layer 112, outer surfaces of the top electrode 106, and outer surfaces of the first anti-reflective layer 202. In some embodiments, the cap layer 204 is formed with a thickness of about 100 to about 200 angstroms, such as about 150 angstroms, and/or is formed conformally. Further, in some embodiments, the cap layer 204 is formed of an oxide, such as PE oxide. The process for forming the cap layer 204 may comprise depositing or otherwise growing the cap layer 204 by, for example, vapor deposition.

In some embodiments, formation of the cap layer 204 is immediately preceded by treatment of the top electrode 106 to remove native oxide from outer surfaces of the top electrode 106. The process for treating the top electrode 106 may comprise, for example, exposing the top electrode 106 to plasma. In some embodiments, the plasma is generated from nitrous oxide gas, using excitation energy of about 150 to about 250 watts, such as about 200 watts, using a temperature of about 350 to about 450 degrees Celsius, such as about 400 degrees Celsius, or a combination of the foregoing. Further, in some embodiments, the top electrode 106 is exposed to the plasma for about 30 to about 60 seconds, such as about 45 seconds.

Also illustrated by the cross-sectional view 500 of FIG. 5, a second anti-reflective layer 206 is formed over and lining the cap layer 204. In some embodiments, the second anti-reflective layer 206 is formed with a thickness of about 250 to about 400 angstroms, such as about 320 angstroms, and/or is formed conformally with a uniform thickness. Further, in some embodiments, the second anti-reflective layer 206 is formed of silicon oxy-nitride. The process for forming the cap layer 204 may comprise depositing or otherwise growing the cap layer 204 by, for example, vapor deposition.

Figure 6:
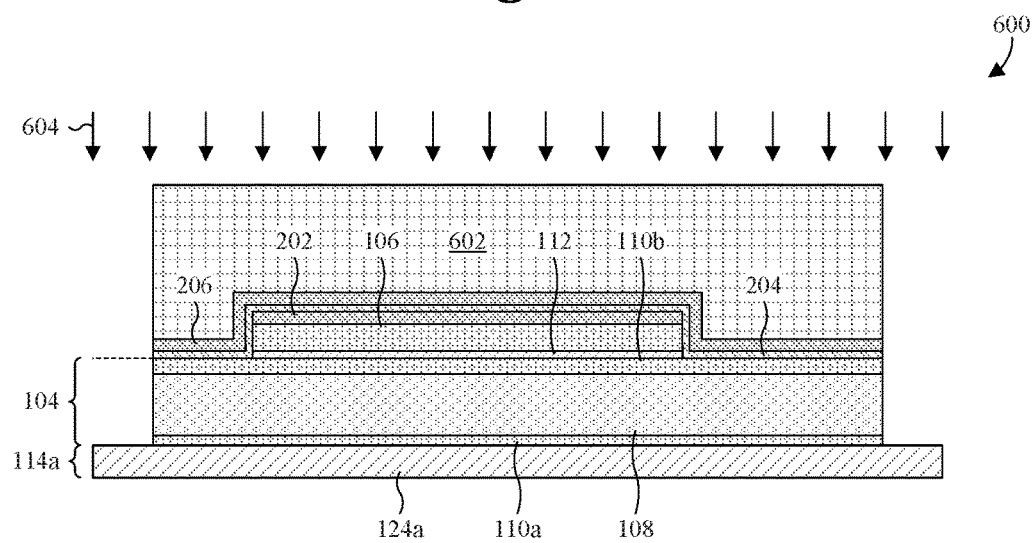

As illustrated by the cross-sectional view 600 of FIG. 6, a second etch is selectively performed into the second anti-reflective layer 206, the cap layer 204, the first and second diffusion barrier layers 110a, 110b, and the metal layer 108. The second etch results in a bottom electrode 104 masked by the cap layer 204 and the second anti-reflective layer 206, and arranged over the lower ILD layers 124a.

In some embodiments, the process for performing the second etch comprises forming and patterning a second photoresist layer 602 over the second anti-reflective layer 206. Further, in some embodiments, the process comprises applying one or more etchants 604 to the second anti-reflective layer 206, the cap layer 204, the first and second diffusion barrier layers 110a, 110b, and the metal layer 108 with the second photoresist layer 602 in place, and subsequently stripping the second photoresist layer 602. The second photoresist layer 602 may be formed and/or stripped as described with regard to the first etch.

Figure 7:
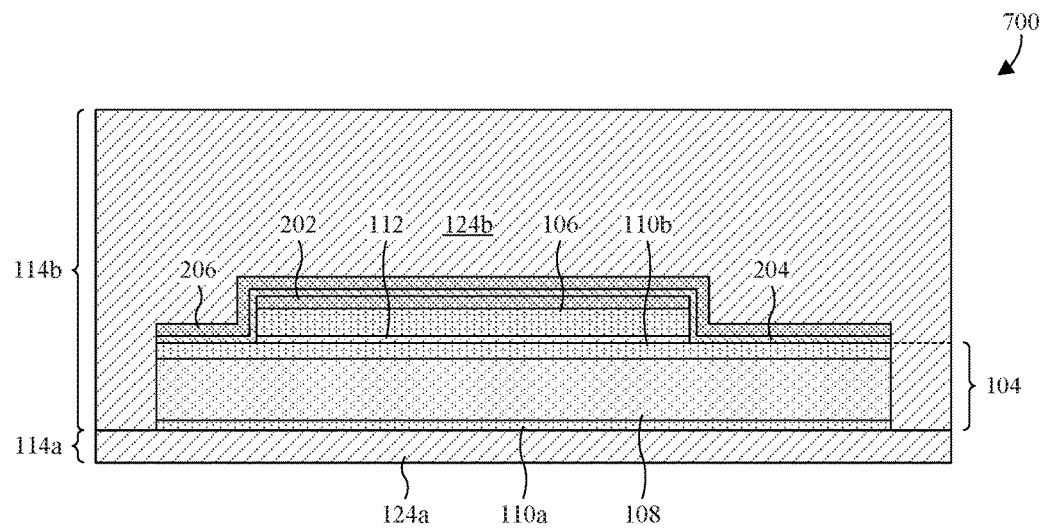

As illustrated by the cross-sectional view 700 of FIG. 7, an upper ILD layer 124b of an upper interconnect structure 114b is formed covering the lower interconnect structure 114a and the second anti-reflective layer 206. Further, the upper ILD layer 124b is formed with an upper or top surface that is planar. In some embodiments, the process for forming the upper ILD layer 124b comprises depositing or growing the upper ILD layer 124b, and subsequently performing a planarization into the upper or top surface of the upper ILD layer 124b. The upper ILD layer 124b may be deposited or grown by, for example, vapor deposition, ALD, thermal oxidation, or a combination of the foregoing. The planarization may be performed by, for example, a chemical mechanical polish (CMP).

Figure 8:
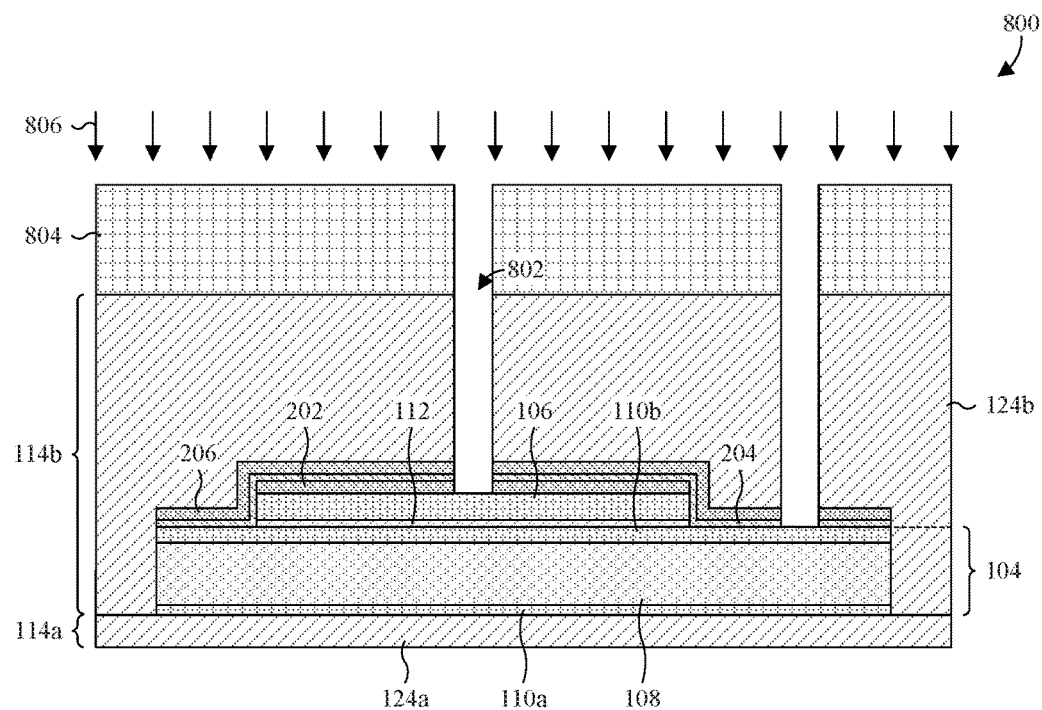

As illustrated by the cross-sectional view 800 of FIG. 8, a third etch is selectively performed into the upper ILD layer 124b, the cap layer 204, and the first and second anti-reflective layers 202, 206 to form via openings 802 exposing the bottom and top electrodes 104, 106. In some embodiments, the process for performing the third etch comprises forming and patterning a third photoresist layer 804 over the upper ILD layer 124b. Further, in some embodiments, the process comprises applying one or more etchants 806 to the upper ILD layer 124b, the cap layer 204, and the first and second anti-reflective layers 202, 206 with the third photoresist layer 804 in place, and subsequently stripping or otherwise removing the third photoresist layer 804. The third photoresist layer 804 may be formed and/or stripped as described with regard to the first etch.

As illustrated by the cross-sectional view 900 of FIG. 900, vias 122a are formed in the via openings 802 (see FIG. 8). In some embodiments, the process for forming the vias 122a comprises depositing or growing a conductive via layer 120a filling the via openings 802, and subsequently performing a planarization into the conductive via layer 120a to coplanarize an upper or top surface of the conductive via layer 120a with the upper or top surface of the upper ILD layer 124b. The conductive via layer 120a may be, for example, grown by ECP. Alternatively, the conductive via layer 120a may be, for example, deposited by vapor deposition or ALD. The planarization may be, for example, performed by CMP.

Figure 9:
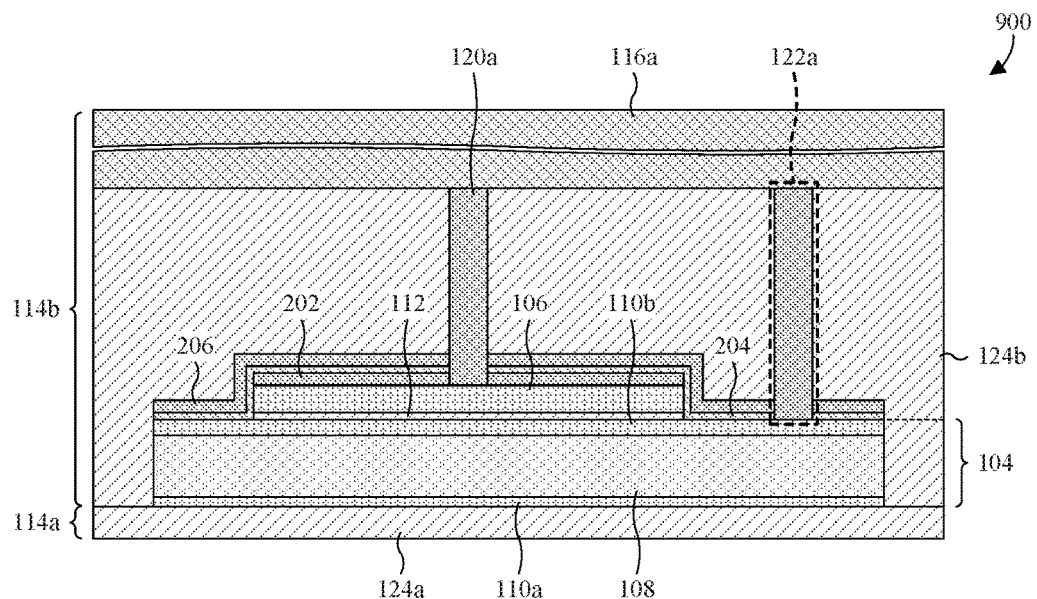

Also illustrated by the cross-sectional view 900 of FIG. 9, a conductive feature layer 116a is formed over the upper ILD layer 124b and the conductive via layer 120a. In some embodiments, the process for forming the conductive feature layer 116a comprises depositing or growing the conductive feature layer 116a over the upper ILD layer 124b. For example, the conductive feature layer 116a may be deposited or grown by vapor deposition, ALD, ECP, or a combination of the foregoing.

Figure 10:
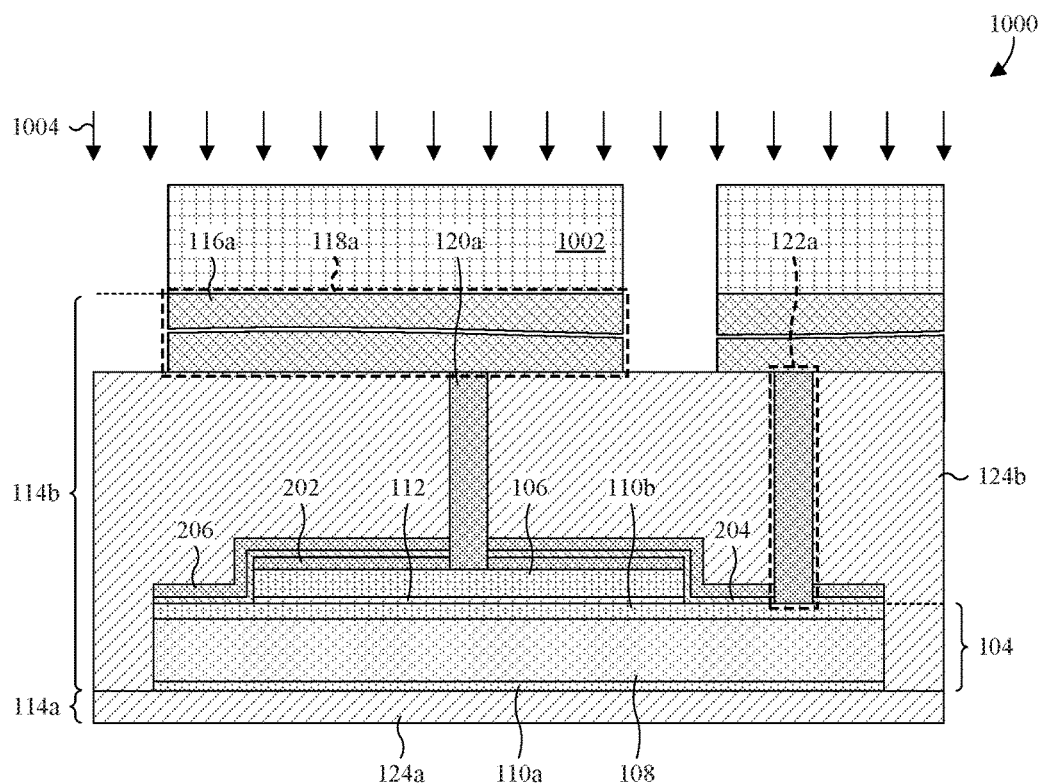

As illustrated by the cross-sectional view 1000 of FIG. 10, a fourth etch is selectively performed into the conductive feature layer 116a to form conductive features 118a over the upper ILD layer 124b. In some embodiments, the process for performing the fourth etch comprises forming and patterning a fourth photoresist layer 1002 over the conductive feature layer 116a. Further, in some embodiments, the process comprises applying one or more etchants 1004 to the conductive feature layer 116a with the fourth photoresist layer 1002 in place, and subsequently stripping the fourth photoresist layer 1002. The fourth photoresist layer 1002 may be formed and/or stripped as described with regard to the first etch.

While the vias 122a and the conductive features 118a were described as being formed by a single-damascene-like process, it is to be appreciated that a dual-damascene-like process may alternatively be performed to form the vias 122a and the conductive features 118a. A single-damascene-like process and a dual-damascene-like process are respectively a single-damascene process and a dual-damascene process that are not restricted to copper. As such, in some embodiments, a single deposition or growth of material is used to form both the vias 122a and the conductive features 118a.

Figure 11:
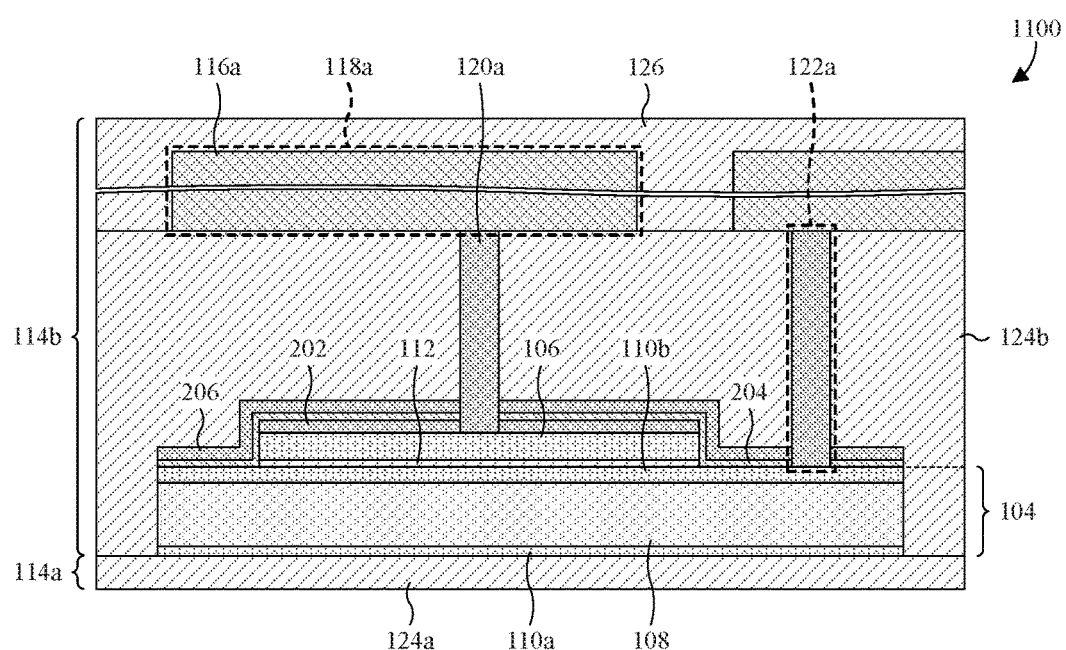

As illustrated by the cross-sectional view 1100 of FIG. 11, a passivation layer 126 of the upper interconnect structure 114b is formed covering the conductive features 118a and with an upper or top surface that is planar. In some embodiments, the process for forming the passivation layer 126 comprises depositing or growing the passivation layer 126, and subsequently performing a planarization into the upper or top surface of the passivation layer 126. The passivation layer 126 may be deposited or otherwise grown by, for example, vapor deposition, ALD, thermal oxidation, or a combination of the foregoing. The planarization may be performed by, for example, a CMP.

Figure 12:
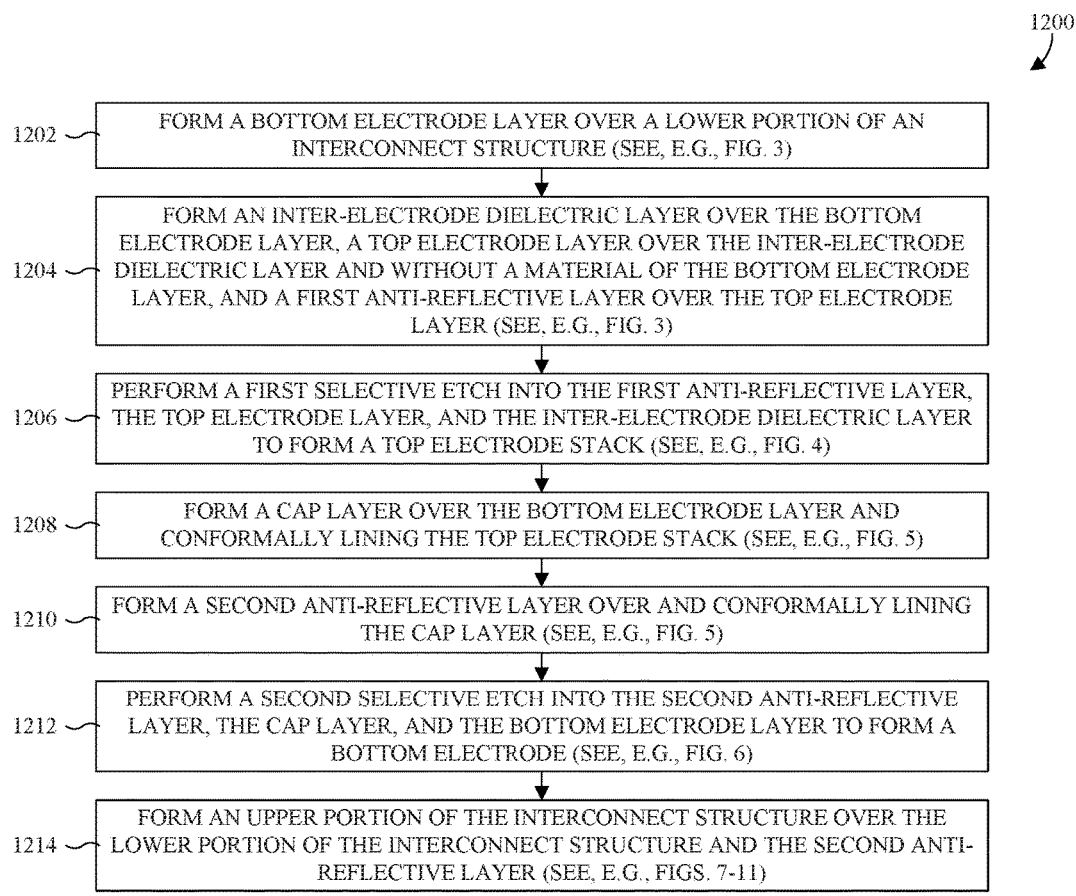
FIG. 12 illustrates a flowchart of some embodiments of the method of FIGS. 3-11.

With reference to FIG. 12, a flowchart 1200 of some embodiments of the method of FIGS. 3-11 is provided.

At 1202, a bottom electrode layer is formed over a lower portion of an interconnect structure. See, for example, FIG. 3.

At 1204, an inter-electrode dielectric layer is formed over the bottom electrode layer, a top electrode layer is formed over the inter-electrode dielectric layer and without a material of the bottom electrode, and a first anti-reflective layer is formed over the top electrode layer. See, for example, FIG. 3. The material may be, for example, a material, such as aluminum copper, that is subject to erosion by wet or dry cleaning processes performed to strip or otherwise remove photoresist during photolithography processes.

At 1206, a first selective etch is performed into the first anti-reflective layer, the top electrode layer, and the inter-electrode dielectric layer to form a top electrode stack. See, for example, FIG. 4. Advantageously, since the top electrode is formed without the material of the bottom electrode, a top electrode of the stack may be formed without sidewall damage from wet or dry cleaning processes performed to strip photoresist used by the first selective etch.

At 1208, a cap layer is formed over the bottom electrode layer and conformally lining the top electrode stack. See, for example, FIG. 5.

At 1210, a second anti-reflective layer is formed over and conformally lining the cap layer. See, for example, FIG. 5.

At 1212, a second selective etch is performed into the second anti-reflective layer, the cap layer, and the bottom electrode layer to form a bottom electrode. See, for example, FIG. 6.

At 1214, an upper portion of the interconnect structure is formed over the lower portion of the interconnect structure and the second anti-reflective layer. See, for example, FIGS. 7-11.

While the method described by the flowchart 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides an IC comprising a capacitor. The capacitor comprises a bottom electrode, an inter-electrode dielectric layer, and a top electrode. The bottom electrode comprises a metal layer and a diffusion barrier layer overlying the metal layer. The metal layer comprises a first material. The inter-electrode dielectric layer is arranged over the bottom electrode. The top electrode is arranged over and spaced from the bottom electrode by the inter-electrode dielectric layer. Further, the top electrode is devoid of the first material.

In other embodiments, the present disclosure provides A method of forming a capacitor. A bottom electrode layer is formed with a first material. An inter-electrode dielectric layer is formed over the bottom electrode layer. A top electrode layer is formed over the inter-electrode dielectric layer. The top electrode layer is formed without the first material. A first etch is performed into the top electrode layer and the inter-electrode dielectric layer to form a top electrode. A second etch is performed into the bottom electrode layer to form a bottom electrode.

In yet other embodiments, the present disclosure provides an IC comprising a capacitor. The capacitor comprises a bottom electrode and a top electrode. The bottom electrode comprises a metal layer and a pair of diffusion barrier layers respectively arranged on a bottom surface of the metal layer and a top surface of the metal layer. The metal layer is a first material and the diffusion barrier layers are a second material different than the first material. The top electrode is arranged on the bottom electrode and spaced from the bottom electrode by an inter-electrode dielectric layer. The top electrode comprises only the second material and shares a width with the inter-electrode dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a capacitor, the method comprising:
    forming a bottom electrode layer with a first material;
    forming an inter-electrode dielectric layer over the bottom electrode layer;
    forming a top electrode layer over the inter-electrode dielectric layer, wherein the top electrode layer is formed without disposing the first material;
    performing a first etch into the top electrode layer and the inter-electrode dielectric layer to form a top electrode;
    forming a capping layer covering the bottom electrode layer and the top electrode, wherein the capping layer extends along and contacts sidewalls of the top electrode and the inter-electrode dielectric layer, and wherein the capping layer extends laterally along and contacts a top surface of the bottom electrode layer;
    forming a photoresist layer on the capping layer; and
    performing a second etch into the capping layer and the bottom electrode layer with the photoresist layer in place, wherein the second etch forms a bottom electrode.

2. The method according to claim 1, further comprising:
    forming the top electrode layer with only a second material different than the first material.

3. A method of forming a capacitor, the method comprising:
    forming a bottom electrode layer with a first material, wherein the forming of the bottom electrode layer comprises:
        forming a first diffusion barrier layer of a second material and over a lower portion of an interconnect structure;
        forming a metal layer of the first material and over the first diffusion barrier layer; and
        forming a second diffusion barrier layer of the second material and over the metal layer;
    forming an inter-electrode dielectric layer over the bottom electrode layer;
    forming a top electrode layer over the inter-electrode dielectric layer, wherein the top electrode layer is formed without disposing the first material;
    performing a first etch into the top electrode layer and the inter-electrode dielectric layer to form a top electrode;
    forming a capping layer covering the bottom electrode layer and the top electrode, wherein the capping layer extends along and contacts sidewalls of the top electrode and the inter-electrode dielectric layer, and wherein the capping layer extends laterally along and contacts a top surface of the bottom electrode layer;
    forming a photoresist layer on the capping layer; and
    performing a second etch into the capping layer and the bottom electrode layer with the photoresist layer in place, wherein the second etch forms a bottom electrode.

4. The method according to claim 1, further comprising:
    forming a first anti-reflective layer over and contacting a top surface of the top electrode layer, wherein the first anti-reflective layer has a same width as the top electrode, and wherein the capping layer is further formed over the first anti-reflective layer and lining sidewalls of the first anti-reflective layer; and
    performing the first etch into the first anti-reflective layer.

5. The method according to claim 4, further comprising:
forming a second anti-reflective layer over and lining the capping layer, wherein the second anti-reflective layer, the bottom electrode, and the capping layer have the same widths; and
performing the second etch into the second anti-reflective layer.

6. The method according to claim 4, further comprising:
performing plasma treatment of the top electrode to remove native oxide on the top electrode, wherein the performing of the plasma treatment comprises generating plasma from nitrous oxide gas; and
immediately following the plasma treatment, forming the capping layer.

7. A method of forming a capacitor, the method comprising:
forming a bottom electrode layer on a substrate, wherein the bottom electrode layer comprises copper;
forming an inter-electrode dielectric layer on the bottom electrode layer;
forming a top electrode layer on the inter-electrode dielectric layer, wherein the top electrode layer is devoid of copper;
forming a first photoresist layer on the top electrode layer;
performing a first etch into the top electrode layer and the inter-electrode dielectric layer with the first photoresist layer in place to form a top electrode and an inter-electrode dielectric structure spacing the top electrode over the bottom electrode layer;
performing a stripping process to strip the first photoresist layer without damaging a sidewall of the top electrode; and
performing a second etch into the bottom electrode layer to form a bottom electrode.

8. The method according to claim 7, further comprising:
forming a second photoresist layer on the top electrode and the bottom electrode layer;
performing the second etch into the bottom electrode layer with the second photoresist layer in place to form the bottom electrode; and
performing the stripping process to strip the second photoresist layer, wherein stripping the second photoresist layer damages a copper sidewall of the bottom electrode.

9. The method according to claim 7, wherein forming the bottom electrode layer comprises:
forming a first diffusion barrier layer on the substrate;
forming a copper-based layer on the first diffusion barrier layer; and
forming a second diffusion barrier layer on the copper-based layer, wherein the first and second diffusion barrier layers are the same material as the top electrode layer, and wherein the first and second diffusion barrier layers and the copper-based layer define the bottom electrode layer.

10. The method according to claim 9, wherein the copper-based layer contacts the first diffusion barrier layer, wherein the second diffusion barrier layer contacts the copper-based layer, wherein the inter-electrode dielectric layer contacts the second diffusion barrier layer, and wherein the top electrode layer contacts the inter-electrode dielectric layer.

11. The method according to claim 10, further comprising:
forming an interlayer dielectric (ILD) layer covering the top and bottom electrodes and the inter-electrode dielectric structure; and
forming a via extending through the ILD layer and contacting a top surface of the top electrode.

12. The method according to claim 1, further comprising:
forming an interlayer dielectric (ILD) layer covering the top and bottom electrodes and the inter-electrode dielectric layer; and
forming a pair of vias extending through the ILD layer respectively to the top and bottom electrodes, wherein a first via of the pair is formed overlying and contacting the top electrode, wherein a second via of the pair is formed overlying and contacting the bottom electrode, wherein the first and second vias are formed laterally contacting sidewalls of the capping layer, and wherein the first and second vias have the same widths.

13. The method according to claim 8, further comprising:
forming a first anti-reflective layer on the top electrode layer, wherein the first photoresist layer is formed on the first anti-reflective layer, and wherein the first etch is further performed into the first anti-reflective layer with the first photoresist layer in place;
forming a capping layer covering and contacting the bottom electrode layer and the first anti-reflective layer, wherein the capping layer laterally contacts sidewalls of the first anti-reflective layer, the top electrode, and the inter-electrode dielectric structure;
forming a second anti-reflective layer covering and conformally lining the capping layer, wherein the second anti-reflective layer contacts the capping layer, and wherein the first and second anti-reflective layers are the same material;
wherein the second photoresist layer is further formed on the second anti-reflective layer, and wherein the second etch is performed into the capping layer and the second anti-reflective layer with the second photoresist layer in place.

14. The method according to claim 3, further comprising:
forming the top electrode layer with only the second material, wherein the second material is different than the first material.

15. The method according to claim 3, further comprising:
forming a first anti-reflective layer over and contacting a top surface of the top electrode layer, wherein the first anti-reflective layer has a same width as the top electrode, and wherein the capping layer is further formed over the first anti-reflective layer and lining sidewalls the first anti-reflective layer; and
performing the first etch into the first anti-reflective layer.

16. The method according to claim 15, further comprising:
forming a second anti-reflective layer over and lining the capping layer, wherein the second anti-reflective layer, the bottom electrode, and the capping layer have the same widths; and
performing the second etch into the second anti-reflective layer.

17. The method according to claim 15, further comprising:
performing plasma treatment of the top electrode to remove native oxide on the top electrode, wherein the performing of the plasma treatment comprises generating plasma from nitrous oxide gas; and
immediately following the plasma treatment, forming the capping layer.

18. The method according to claim 15, further comprising:

forming an interlayer dielectric (ILD) layer covering the top and bottom electrodes and the inter-electrode dielectric layer; and forming a pair of vias extending through the ILD layer respectively to the top and bottom electrodes, wherein a first via of the pair is formed overlying and contacting the top electrode, wherein a second via of the pair is formed overlying and contacting the bottom electrode, wherein the first and second vias are formed laterally contacting sidewalls of the capping layer, and wherein the first and second vias have the same widths.

19. The method according to claim 15, further comprising:

forming the top electrode layer with only the second material, wherein the second material is different than the first material.

20. The method according to claim 3, further comprising:

forming an interlayer dielectric (ILD) layer covering the top and bottom electrodes and the inter-electrode dielectric layer; and forming a pair of vias extending through the ILD layer respectively to the top and bottom electrodes, wherein a first via of the pair is formed overlying and contacting the top electrode, wherein a second via of the pair is formed overlying and contacting the bottom electrode, wherein the first and second vias are formed laterally contacting sidewalls of the capping layer, and wherein the first and second vias have the same widths.

* * * * *